United States Patent
Nicosia et al.

(10) Patent No.: US 6,470,431 B2
(45) Date of Patent: Oct. 22, 2002

(54) INTERLEAVED DATA PATH AND OUTPUT MANAGEMENT ARCHITECTURE FOR AN INTERLEAVED MEMORY AND LOAD PULSER CIRCUIT FOR OUTPUTTING THE READ DATA

(75) Inventors: Salvatore Nicosia, Palermo; Francesco Tomaiuolo, Monte Sant' Angelo; Fabrizio Campanale, Bari; Luca Giuseppe De Ambroggi, Catania; Promod Kumar, Motta S. Anastasia, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 49 days.

(21) Appl. No.: 09/774,542

(22) Filed: Jan. 31, 2001

(65) Prior Publication Data
US 2001/0034819 A1 Oct. 25, 2001

(30) Foreign Application Priority Data

Jan. 31, 2000 (EP) .............................................. 00830068
Apr. 17, 2000 (EP) .............................................. 00830291

(51) Int. Cl.[7] ................................................ C06F 12/00
(52) U.S. Cl. ...................... 711/157; 711/5; 365/230.02; 365/230.03; 365/230.04
(58) Field of Search ................ 711/5, 157; 365/230.02, 365/230.03, 230.04

(56) References Cited

U.S. PATENT DOCUMENTS 5,559,990 A   9/1996   Cheng et al. ............... 395/484
5,596,539 A   1/1997   Passow et al. .............. 365/210
5,696,917 A   12/1997  Mills et al. .................. 395/401
5,966,724 A   10/1999  Ryan .......................... 711/105
6,111,807 A * 8/2000   Ooishi .................... 365/230.01
6,259,647 B1 * 7/2001  Ooishi .................... 365/230.01
6,337,832 B1 * 1/2002  Ooishi et al. ............... 365/233

FOREIGN PATENT DOCUMENTS

EP   0561370   9/1993   ............ G11C/7/00
EP   0961283   12/1999  ............ G11C/7/00

* cited by examiner

Primary Examiner—Do Hyun Yoo
Assistant Examiner—Mehdi Namazi
(74) Attorney, Agent, or Firm—Lisa K. Jorgenson; Allen, Dyer, Doppelt, Milbrath & Gilchrist, P.A.

(57) ABSTRACT

An interleaved memory having an interleaved data path includes an array of memory cells divided into a first bank of memory cells and a second bank of memory cells, first and second arrays of sense amplifiers respectively coupled to the first and second bank of memory cells, and first and second read registers respectively coupled to the first and second arrays of sense amplifiers. A control and timing circuit is connected to the first and second arrays of sense amplifiers and has inputs for receiving externally generated command signals, and outputs for providing path selection signals and a control signal. A third register is connected to the first and second read registers and has inputs for receiving read data therein as a function of the path selection signals. An array of pass-gates are connected to the third register and are controlled in common by the control signal for enabling a transfer of the read data stored in the third register to an array of output buffers.

34 Claims, 12 Drawing Sheets

INTERLEAVED DATA PATH AND OUTPUT MANAGEMENT ARCHITECTURE FOR AN INTERLEAVED MEMORY AND LOAD PULSER CIRCUIT FOR OUTPUTTING THE READ DATA

FIELD OF THE INVENTION

The present invention relates in general to memory devices, and in particular, to an interleaved memory readable in a synchronous mode or in a random access asynchronous mode with fast access times. The interleaved memory is readable in the synchronous mode by successive locations with a sequential type of access, commonly referred to as a burst mode.

BACKGROUND OF THE INVENTION

In a standard memory a read cycle is defined from a request of data effected by the input of a new address, to the final output of the bits stored in the addressed location (byte, word, etc.). Internally, the reading process evolves through several steps. These steps start from the acquisition of the new address, to its decoding, to the generation of synchronizing pulses of the sensing circuits, and to the output of the read data.

The ATD (Address Transition Detection) signal recognizes a change of the address input by the external circuitry, and therefore, the new request of access and initiates a new read cycle. After enabling the sense amplifiers by the signal SAenable, an equalization of the sensing circuitry takes place. At the end of which, as timed by the signal EQZ, the effective reading of the memory cells takes place. Finally, after a certain interval of time that may vary from device to device, by way of a signal SAlatch, the recording of the read data into the latches in cascade to the sense amplifiers takes place, from where the read word may be transferred to the output buffers.

In memory devices designed for a synchronous read mode with a sequential type (burst) of access, the reading process exploits the fact that the reading takes place by successive locations. That is, the subsequent memory location to be read, and therefore, its address, is predictable from the address of the location being currently read.

A subgroup of these sequential (burst) synchronous read mode memories is represented by the interleaved memories. A burst access interleaved memory is described in U.S. Pat. No. 5,559,990, for example. In this type of memory, the cell array is divided in two semi-arrays or banks, each having its own read circuitry. The read streams of the two banks are thereafter superimposed according to one of the most commonly followed approaches, and are outphased (i.e., out of phase) from each other. While on one of the two banks or semi-array the steps of evaluation and transfer of the data to the output are being performed, on the other bank or semi-array (the next location to be addressed) a new read cycle may be started without waiting for the conclusion of the current read cycle that involves the first semi-array.

In interleaved memories, a basic scheme of which is depicted in FIG. 1, the array is divided into two independent banks or semi-arrays, EVEN and ODD, respectively, each having its own independent read path. Typically, there are two counters (one for each bank) containing the address of the currently pointed memory location. In case of simultaneous reading processes evolving respectively on the two semi-arrays, the least significant bit of the address (AO) supports the multiplexing between the EVEN and the ODD banks. If A0=0, the data coming from the EVEN semi-array will be made available at the output. If A0=1, the data coming from the ODD semi-array will be made available at the output.

As it is commonly known, the reading of the two semi-arrays is carried out according to one of two different approaches. A first approach is simultaneous readings and multiplexing of the outputs. A second approach involves time readings that are out of phase.

According to the first approach, the readings are simultaneous on the two banks. The data read are stored in respective output registers and made available to the outside world in synchronization with an external clock signal. According to the second approach, the readings on the two semi-arrays have an alternate and interleaved evolution over time.

The first approach, though offering a simpler hardware implementation, limits the minimization of the start times of synchronous read cycles. For a better comprehension, it is necessary to consider the basic steps that are performed when passing from an asynchronous read mode to a synchronous read mode. With reference to the scheme of FIG. 2, and starting the reading from an address X, the latter will be loaded on the EVEN bank counter and on the ODD bank counter, less the least significant bit (A0) of the address. The two counters will point to the same location X of the respective bank or semi-array.

If A0=0: the first read data is relative to the address X of the bank EVEN and the successive read data is the data a X of the bank ODD.

If A0=1: the first read data is relative to the address X of the bank ODD and the successively read data is relative to the X+1 address of the bank EVEN.

In the first case, it is sufficient to perform a simultaneous reading of the two banks and multiplex the outputs. In the second instance, it is necessary to increment the counter before starting the reading on the bank EVEN.

Usually, known synchronous memory devices do not make any initial increment and wait for the successive cycle for incrementing both counters, and therefore, read the location X+1 of the banks EVEN and ODD. This makes the times of the first read cycle and of the second sequential read cycle at best equal to the asynchronous read mode time of the memory.

In general, it may be stated that the efficient management of the read processes has a direct influence of the performance of the memory device. Many read-path architectures have been proposed. Known read-path architectures have generally been conceived for responding efficiently to either one or the other of the two modes of operation: asynchronous or synchronous.

If a memory device is designed to be read in asynchronous mode, it will be generally provided with a rather simple control circuitry for the read data streams. This allows the use of adaptive structures, such as dummy wordlines and dummy sense amplifiers, while leaving the reading circuitry free to evolve as fast as possible in order to achieve the shortest asynchronous access delays.

In contrast, in memory devices designed to function in a burst access mode or in a synchronous read mode, the possibility of making available in output a certain number of words read and stored in advance, permits, after a first asynchronous access, as long as it may be, a series of extremely fast read cycles. In this case though, the control logic must intervene extensively to manage the sense amplifiers which should not be left to evolve freely but be enabled, equalized and read at precise instants established by the control system. Prior European Patent Application Serial No. EP-98830801, filed on Dec. 30, 1998, and Italian Patent Application Serial No. MI99A00248, filed on Nov. 26, 1999, describe burst-mode EPROM devices with the above characteristics. These patent applications are both incorporated herein by reference in their entirety, and are assigned to the assignee of the present invention.

The access mode in a reading phase of operation is set to a specific protocol of use of two of the external protocol signals. These two signals are the address input latches enabling signal ALE and of the read stimulation signal RD.

The counters of the two semi-arrays, or the counter of the first bank and a more simpler register which functions as an address counter of the second bank, are incremented distinctly from one another. This is different from what is commonly done in interleaved memory devices. The readings are thus out of phase on the two banks from the first (asynchronous) read cycle. In this way, the memory device of the invention is perfectly able to switch to a synchronous mode reading phase at any time, which practically cuts in half the access time to such a mode.

The two different reading processes, according to an asynchronous random access mode and according to a synchronous burst access mode remain congruent with each other, having an alternate and interleaved evolution in time, as described in European Patent Application No. 00830068.3, filed on Jan. 31, 2000. This application is incorporated herein by reference in its entirety, and is assigned to the assignee of the present invention.

The reading of a standard memory is an asynchronous process that, starting from an initial stimulation generated by the switching of at least an external address line, evolves as far as to produce the new data to be output.

SUMMARY OF THE INVENTION

In view of the foregoing background, it is an object of the present invention to provide an improved interleaved data path and output management architecture for an interleaved memory that satisfies the particular control requirements that are imposed for reading an interleaved memory in an asynchronous random access mode or in a synchronous burst access mode.

The architecture of the invention is based on using three distinct registers. The first two of which are respectively dedicated to store the data read by respective arrays of sense amplifiers for two banks of memory cells of an interleaved memory. The third register receives as an input, under control of the timing circuitry of the memory, the data previously stored in one of the first two registers. The data passes through an array of pass-gates which are driven in common by a control signal generated by the timing circuitry. The data loaded in the third register is eventually transferred to the inputs of the output buffers, which are in turn controlled by external signals of the read protocol of the memory.

The structure employs three distinct registers for storing the data, which allows management in a relatively straightforward manner, operation of the memory device under all conditions contemplated by the protocol.

The use of three distinct registers permits readings on the two banks that are substantially uncorrelated among each other. The readings may in fact be out of phase or simultaneous depending on the starting stimulation and at the end of the read process. The sense amplifiers of each bank update a respective register coupled in cascade on the sense amplifier array of each bank.

According to a preferred embodiment of the invention, the control and timing circuit of the memory includes a special pulse generating circuit for generating signals for interleaved loading of data from the pair of registers in cascade of the two respective banks of sense amplifiers. These signals are generated into an output data register. A control circuit for the output buffers uses a peculiar locking mechanism that allows the duration of the load pulses for data in the output register to be advantageously extended, and the downloading of the data toward the output buffers.

These and other aspects will become even more evident through the following description of several preferred embodiments of the invention.

DETAILED DESCRIPTION OF THE PREFERRED EMBODIMENTS

Figure 1:
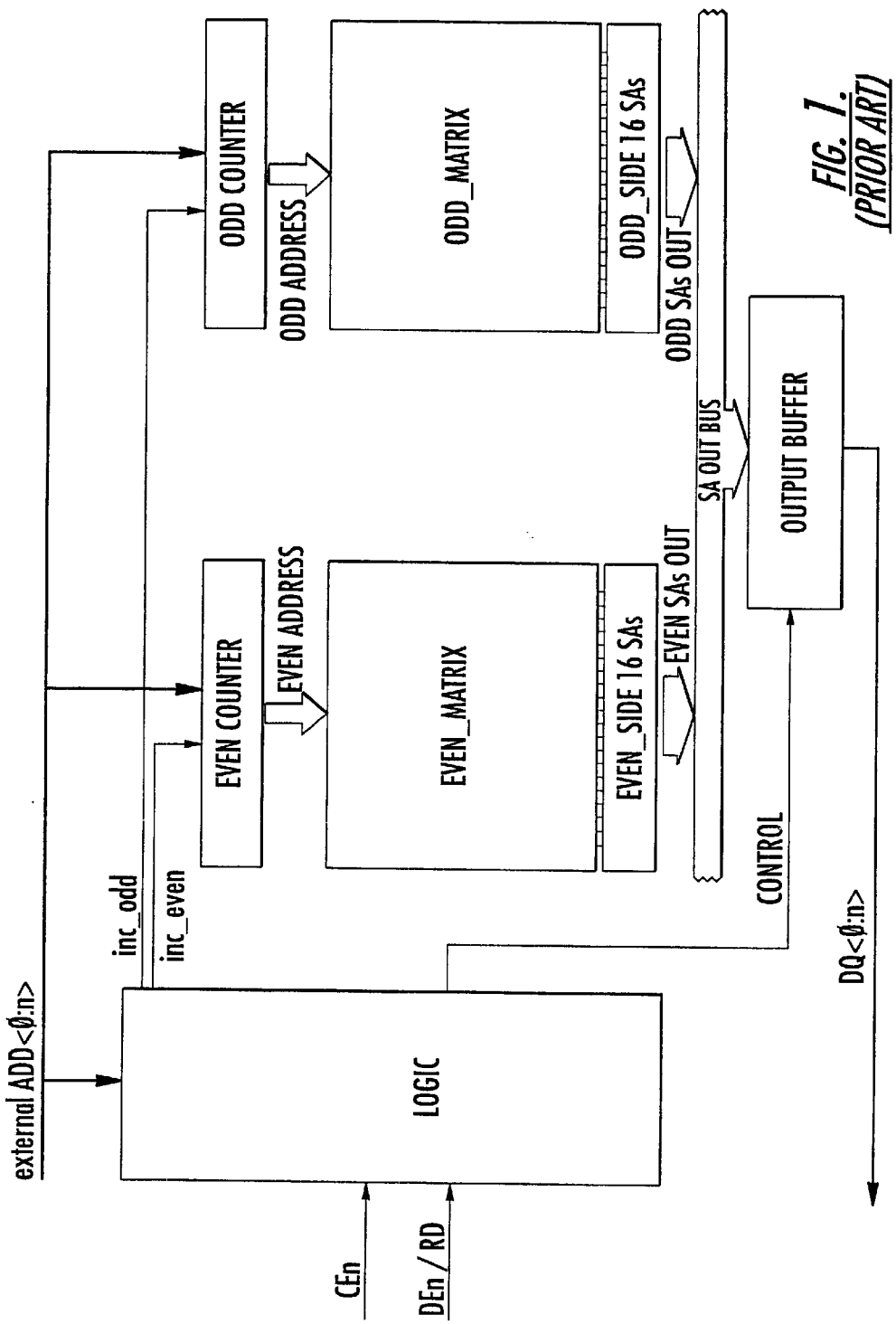
FIG. 1 is a basic block diagram of an interleaved memory according to the prior art.
Figure 2:
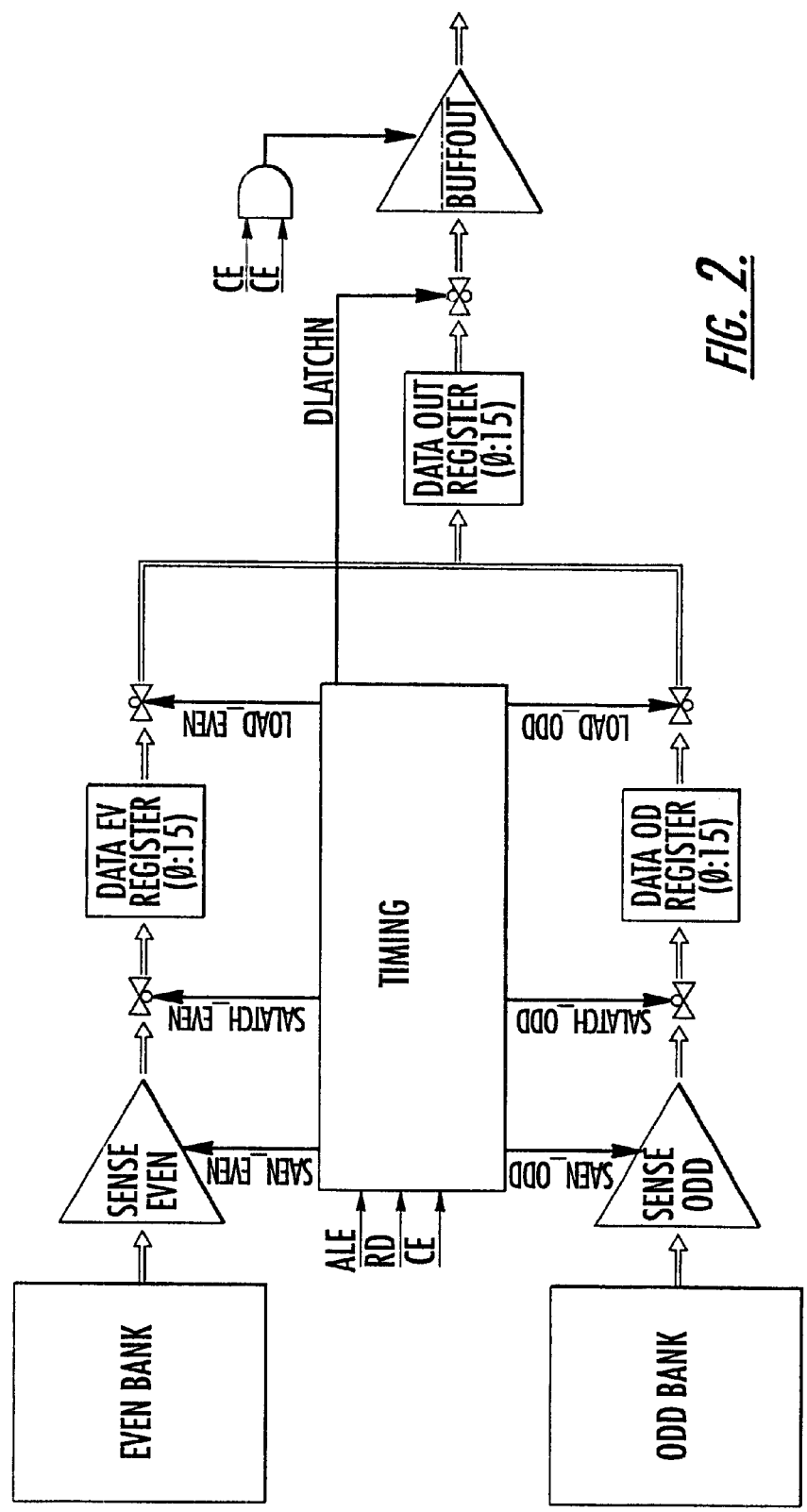
FIG. 2 is a functional block diagram of the interleaved read path according to the present invention.

A functional diagram of the structure of the invention is depicted in FIG. 2, wherein the data path toward the output of the memory is illustrated. The signals SAEN and SAlatch are generated according to the common sequential logic structures of an interleaved memory but the structures are duplicated for the two banks in the architecture of this invention.

The protocol may contemplate even the possibility of interrupting a synchronous reading phase with a standby period (of a minimum duration equal to the duration of the single synchronous read cycle), after which the sequential reading restarts from the point in which it was interrupted. This is done by outputting either the last read data or the successive data, depending on the state of the protocol signal RD at the instant of entering the standby. Two situations are possible:

1) Recovery&Resume with RD=1 before the beginning of the standby: the last read data is made available at the output upon restarting; and
2) Recovery&Resume with RD=0 before the beginning of the standby: the data successive to the last read data is made available at the output upon restarting.

To satisfy the above distinct situations, the state machine of the control circuit TIMING of the memory controls the updating of the register DATA OUT REGISTER before the output buffer BUFFOUT, even during the standby of the memory. In particular, if the standby cycle starts while RD=1, no LOAD signal is produced and in the output buffer register remains the last read data. In the case in which RD=0 when a standby period starts, the TIMING block produces a LOAD pulse-that loads the successive data on the register DATA OUT REGISTER. In both cases, upon resuming operation after a standby (Resume), the TIMING block produces a pulse DLATCHN that enables the visibility from outside (on BUFFOUT) of the data present on the output data register.

The presence of three distinct data registers in the output paths allows a great simplification of the state machine of the TIMING circuit that controls the updating of the output data and the start of a new reading cycle.

Moreover the protocol may require that the minimum duration of any Resume cycle be equal to that of a synchronous read cycle (for example, around 25 ns). This time interval would be insufficient to carry out a new complete reading. The storing in advance of the next data when entering a standby overcomes the problem and satisfies even this protocol request.

A memory device embodying the data path and output management architecture of the invention has remarkable flexibility. It can manage a RECOVERY&RESUME cycle as any synchronous cycle. This enhances the robustness because normal asynchronous reading structures are preserved and simplifies to a great measure the internal state machine that controls the memory.

Pulser of the Interlaced Load Signals of Output Data

As mentioned above, a fundamental characteristic of the invention is a discontinuity of the coupling between the sense amplifiers and the internal output data bus. The architecture contemplates a special control structure producing, only at appropriate instants, an enabling signal for loading read data on the internal output data bus, and disconnecting again the sense amplifiers from the internal output data bus, while waiting for a new cycle.

Such an enabling signal must fulfil fundamental requirements such that the sequential reading process takes place in a correct manner. In particular, it must coherently manage both the dependence from the communication protocol between the memory and the external world (thus the synchronization of the output of data) and the information coming from the sense amplifiers on the effective availability of the read data.

All interlaced memory systems, independently from the protocol, contemplate a first random access, in which a certain address is provided from the outside together with a control bit, i.e., the command ALE (Address Latch Enable), such that the memory acquires and stores it in its input address latches. Upon acquiring such an address, a first reading cycle, commonly defined as a MISS CYCLE begins.

Such a first read cycle will require a full access interval because it is an asynchronous cycle. Therefore, during this first read cycle, the LOAD signal must be generated by considering the time that is needed for the read data to be ready at the output of the sense amplifiers before allowing its transfer to the output buffers. Successively, it is possible to provide the output data in a fraction of the time of a complete reading, by virtue of a pipeline read approach, such as that of sequential (burst) cycles, commonly defined as HIT cycles.

In fact, with the first cycle, the mechanism of out of phase readings of the two banks at successive addresses self-generated by the internal control circuit begins. Therefore, the other external control signal RD of the communication protocol effectively provides for the synchronization with the external system by virtue of an intrinsic function of such a signal of requesting data. In such a mode of operation, the LOAD pulse must depend from this synchronization.

Figure 3:
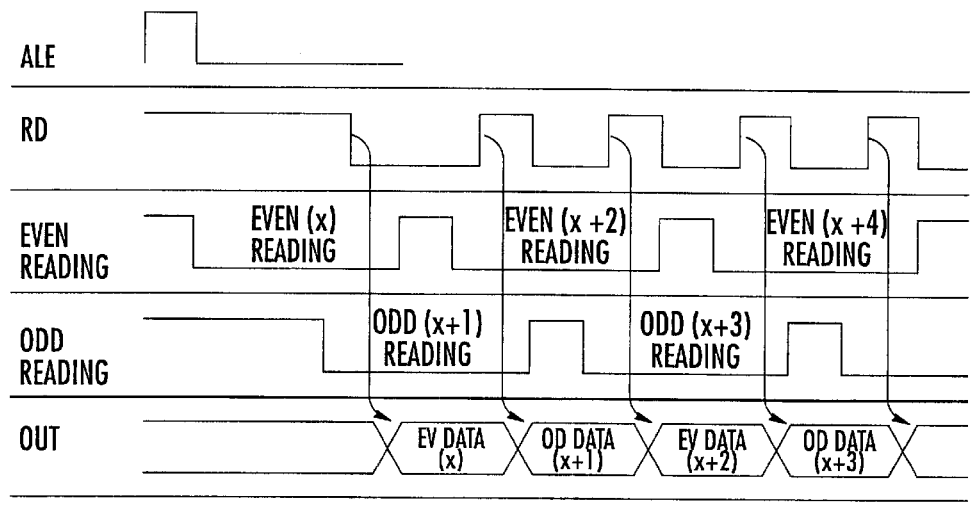
FIG. 3 is a timing diagram showing the dependency of the readings on the two banks from the external control signals according to the present invention.
Figure 4:
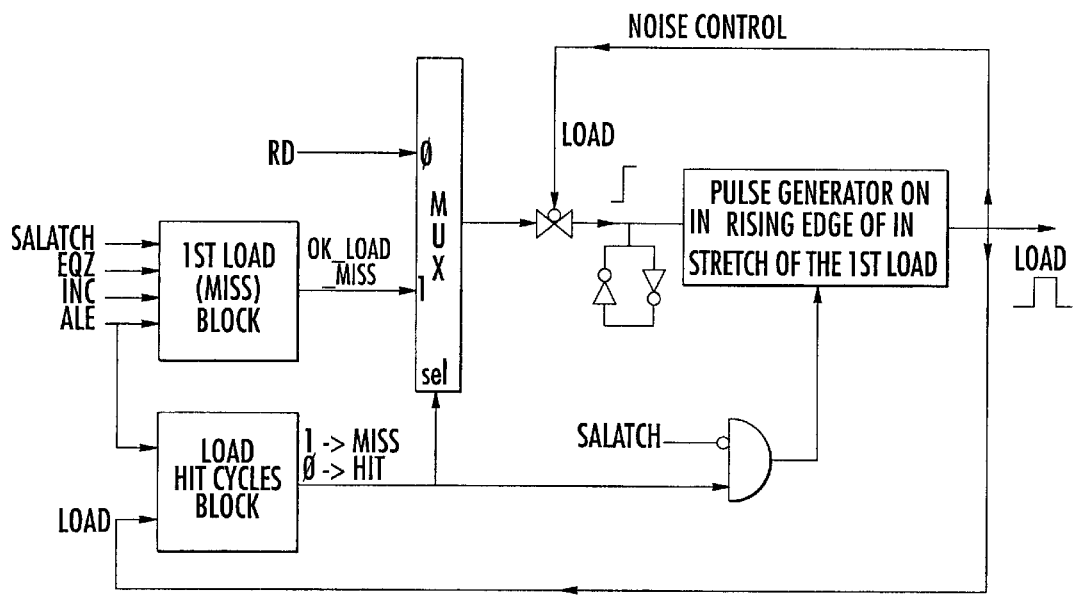
FIG. 4 is a global block diagram of the circuit generating the LOAD pulses according to the present invention.

FIG. 3 illustrates what has been explained above. FIG. 4 depicts a global diagram of the structure that comprises a pulse generator that generates a pulse on the rising edge of a stimulating input signal; a managing block of the LOAD for a first MISS cycle; a block controlling the HIT cycles; and a multiplexer.

MISS CYCLE Control Block

Once the first access to the memory has started, and before generating the LOAD pulse, the system checks that the reading has evolved to the latching phase to avoid connecting the sense amplifiers to the data bus while they are still in an equalization phase. Otherwise incorrect data could be presented at the output or, even worse, during the critical reading cause the inputting of switching noise of the output buffers.

Meanwhile, the control circuit TIMING, depending on the protocol of the system, will have produced an increment pulse INC for the counters of the internal addresses to generate the successive address at which the next reading is to be carried out. The presence of such an increment pulse INC confirms that a HIT cycle is going to take place.

The structure of FIG. 4 exploits this information for deciding the best instant for the production of the LOAD signal, using the signals SAlatch and INC. Having waited for and detected that both events took place before generating the LOAD signal is not a sufficient condition to avoid errors. In fact, to ensure the independence from the protocol and from the operating frequency, the general independence between the arrival instants of the two signals SAlatch and INC must be taken into consideration.

In fact, the SAlatch signal in generally a monostable type signal. That is, it enters in its active phase (in the example it is active-low) to indicate the end of the reading by the sense amplifiers and, after a certain time, or in case of aborted reading, returns to its rest level.

Thus, if because of a series of aborted readings (that occurs very often) or of eventual purely asynchronous accesses (which do not produce any increment), and before getting the INC pulse, the SAlatch switched even only once during its active phase, such information would be registered and the INC pulse would be waited for while the MISS cycle reading has not taken place yet.

Figure 5:
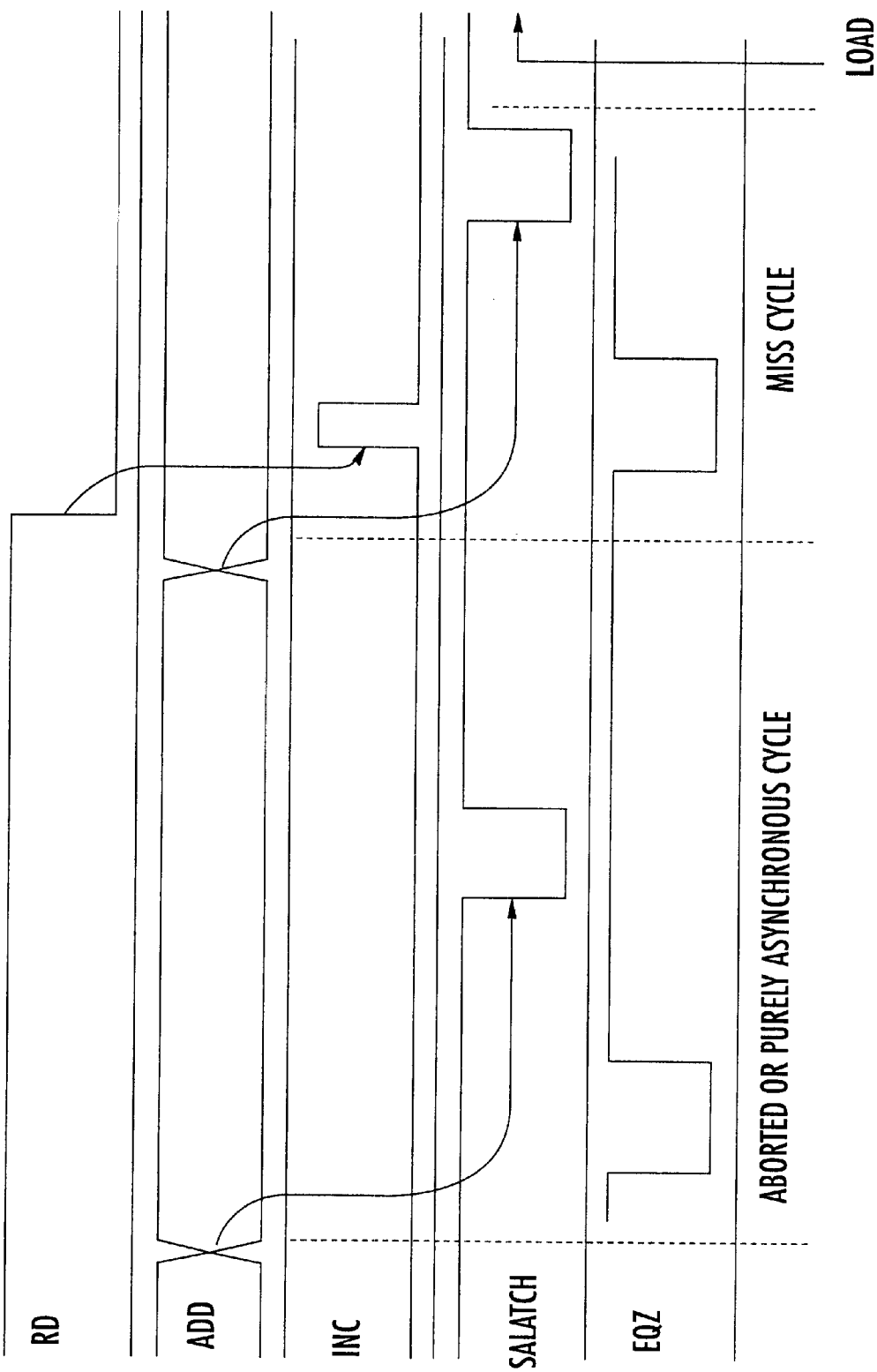
FIG. 5 is a timing diagram showing the dependency of the LOAD pulse and the MISS cycle from the signals SAlatch and INC according to the present invention.

As depicted in FIG. 5, the first SAlatch is not related to the true MISS cycle. Therefore, the LOAD pulse must not be generated immediately after the INC pulse, but it is necessary to wait for a new SAlatch. It is evident that the possibility of operating in a purely asynchronous mode, a synchronous-miss cycle and a synchronous-hit cycle, besides the normal management of aborted reading cycles poses a great problem of recognizing the effective reading cycle in progress to manage it in the most appropriate manner.

Such a situation is solved by setting a flag when the signal SAlatch is detected, and should a read cycle be restarted without having detected the INC signal, such a flag is reset. In practice, the signals INC and SAlatch are used for sending the first LOAD pulse through a sequential structure and the equalization signal EQZ is used to reset the detection flag of Salatch. In fact, during each reading, the equalization phase precedes the latch phase.

The first LOAD (MISS cycle) is generated starting from the rising edge of the signal OK_LOAD. This is obtained as the logic AND of the two flags coming from two SR flip-flops, namely: the detection flag of INC and the detection flag of Salatch. The flip-flop related to the SAlatch signal is reset at each start of a read cycle by the signal EQZ, which precedes SAlatch just at the beginning of the readings, as far as an INC pulse is detected. From this instant onward it is necessary to leave free the latch to capture the forthcoming SAlatch.

On the contrary, the flip-flop related to the INC signal must reset (and remain reset) at each detection and for the whole duration of the ALE signal (Address Latch Enable). This is done because only at the end of the latter the sequential cycles (burst) start, and must be set at the end of the first INC pulse.

Figure 6:
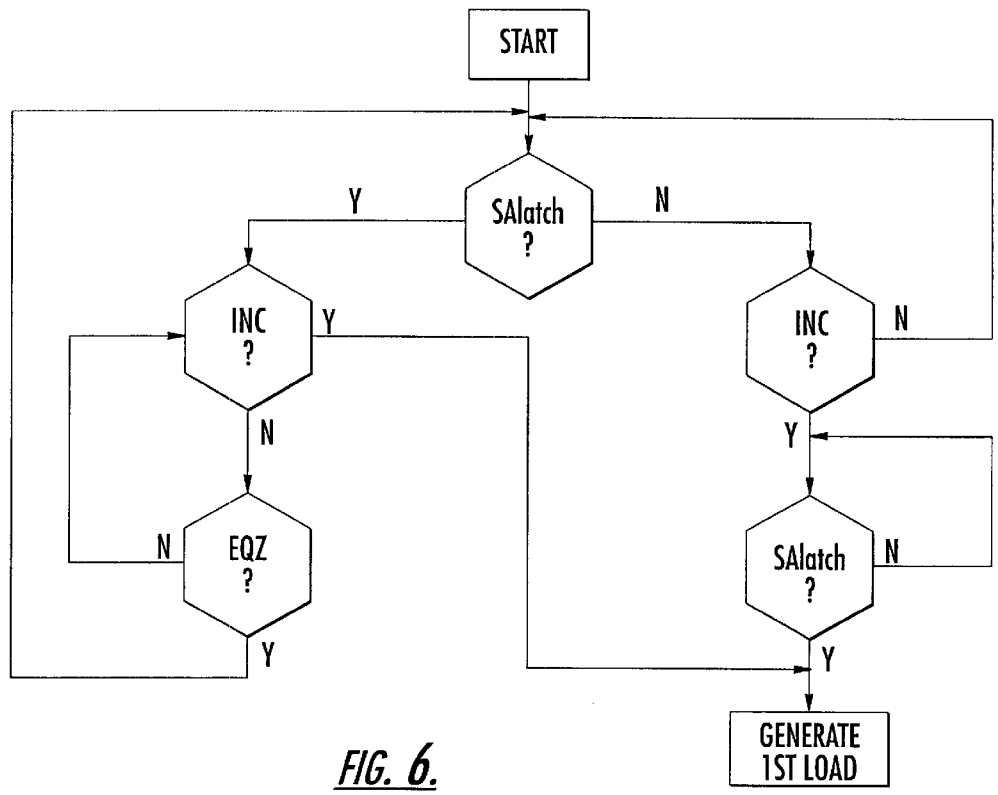
FIG. 6 is a flow chart of the steps for generating the LOAD pulse of a first MISS cycle according to the present invention.
Figure 7:
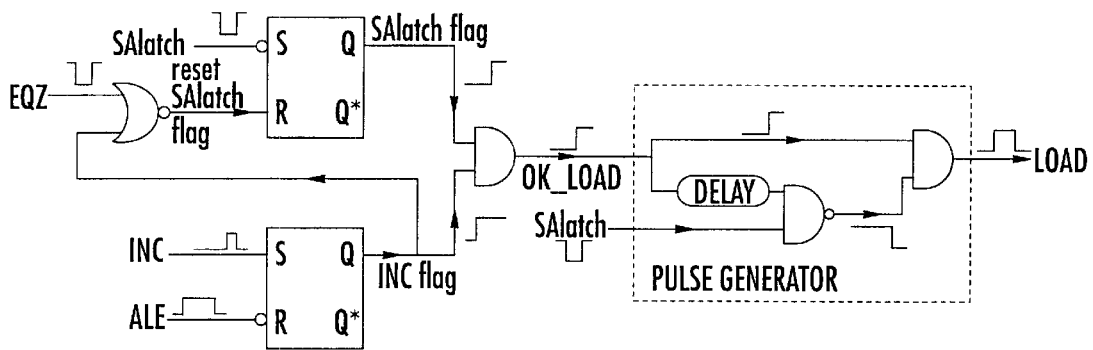
FIG. 7 shows the logic structure of the control block for generating the LOAD pulse of the MISS cycle according to the present invention.

Finally, a last control on the pulser (which generally once stimulated should produce pulses of the same duration) allows a modulation of the duration of this first LOAD pulse making it at least equal to that of the SAlatch pulse. In fact, if between the two flags the one related to SAlatch were the second to arrive, it would be necessary to check that the pulse be sufficiently long to ensure the data transfer to the buffers. A "stretching" of the LOAD signal as far as the SAlatch switches can be advantageously carried out in consideration that the SAlatch signal is intended for this particular function The flow-chart for the generation of the LOAD signal of the first MISS cycle is depicted in FIG. 6. The functional diagram of the relative circuit structure is depicted in FIG. 7.

HIT Cycle Control Block and Detection of the End of the MISS Cycle

It has been remarked above that the control of the MISS cycle waits that for events, INC and SAlatch, to verify before generating the first LOAD pulse. Once this phase has terminated it is necessary to free the pulser from signals coming from the sense amplifiers, because, for the HIT cycles, the timing is managed by the external signal RD. By this external command RD the system communicates from time to time its readiness to accept the read data.

In this mode the LOAD pulser is driven by the signal RD itself. In practice, a multiplexer formed by a transfer-gate is used to decouple the pulse generator from OK_LOAD_MISS and couple it directly to the signal RD, so that at each rising edge of the latter the required LOAD pulse is generated.

The management of the multiplexer may include a master-slave system resetting at the beginning of each MISS cycle with the signal ALE and waiting for the conclusion of the MISS cycle itself. Because, as already said, the first LOAD pulse may have a variable duration (because it depends on the duration of SAlatch), it is necessary to wait for the end of the LOAD pulse to change the signal input to the MUX.

Figure 8:
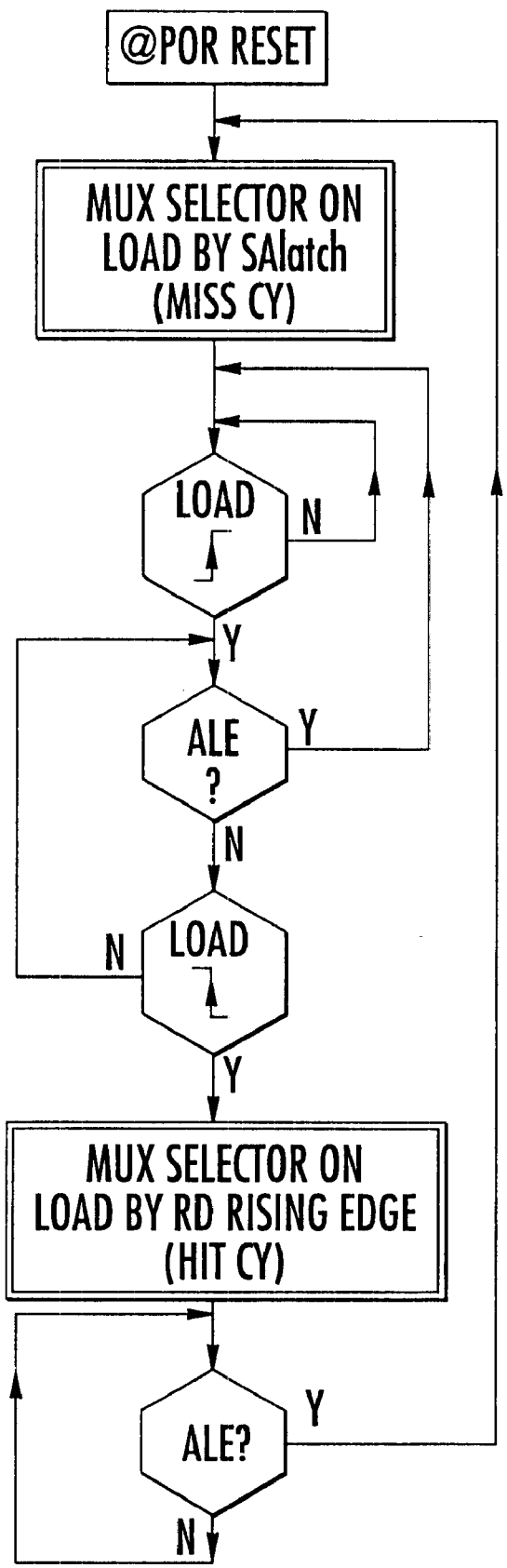
FIG. 8 is a flow chart of the steps for controlling the multiplexing of the LOAD signals for the HIT cycles according to the present invention.
Figure 9:
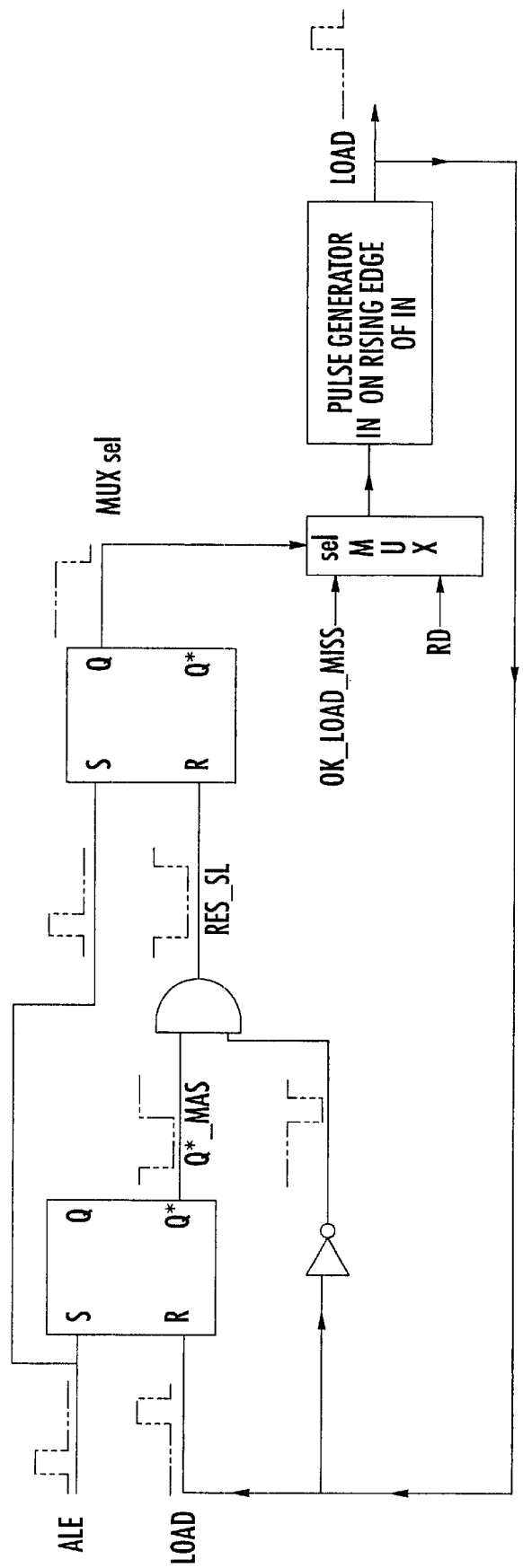
FIG. 9 shows the logic structure of the control block for the multiplexing according to the present invention.

The relative flow chart is depicted in FIG. 8. From a circuit point of view, the described control is formed by a master-slave flip-flop system, as depicted in FIG. 9.

Noise Control

A last consideration about the pulse generator is that the circuit is substantially a monostable circuit capable of deriving the rising edges of the input signal. It must be highlighted that, once the raising edge of RD has been detected, the pulse LOAD that is produced must have an appropriate duration coherent with the time needed to transfer the information from the sense amplifiers to the buffers. That is, it is important to make its duration independent from that of RD, but constant in order to make it manageable always in the same manner by the internal logic.

Consequently, it is useful to introduce a last control which, once the generation of the signal LOAD has been detected, decouples the pulser from the rest of the upstream circuitry (i.e., from OK_LOAD_MISS or from RD). The last control also waits for the end of the pulse and finally couples again the structure to the mux, ready to be triggered again by a new rising edge.

Such an additional control avoids the burden of designing the pulser circuit as a function of the duty-cycle of the clock RD. In fact, should the active phase of the stimulating signal have a shorter duration than the delay of the generator itself, the generated pulse would be coincident with RD and it would not be easily manageable by the internal logic.

Figure 10:
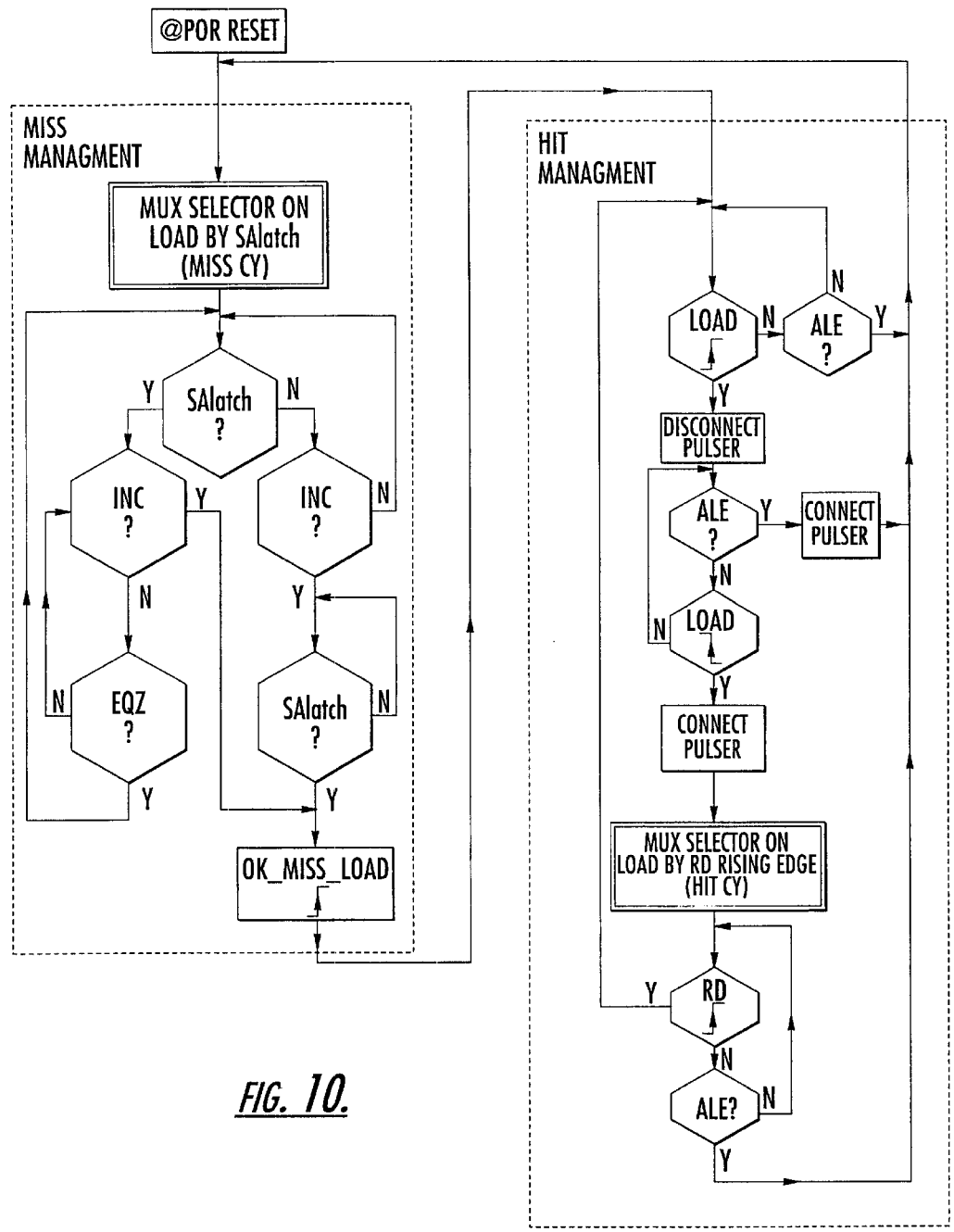
FIG. 10 is a global flow chart of the steps performed by the circuit generating the LOAD pulses according to the present invention.

Moreover, even if the active period of RD lasted sufficiently, the problem of the presence of an eventual glitch on the RD signal that could stimulate an anticipated conclusion of the LOAD phase would not be eliminated. The flow chart of this additional control is depicted in FIG. 10.

Managing the Output of the Read Data

The LOAD and DLATCHN signals directly affect the reading time of the memory because they determine the update of the output. Starting from the generation of a primary LOAD pulse a processing as a function of the priority, and above all of the outphasing among the signals coming from the sense amplifiers and the external control signals, is performed.

Such a processing is carried out by the block BUFFOUT_CTRL of the control circuit TIMING of the memory, whose function is to produce secondary signals. Namely LOAD_EV and LOAD_OD for a correct transfer of the data from the output latch of the respective array of sense amplifiers to the data output register, and for the generation of the DLATCH signal for transferring the data from the output register to the output buffers.

Figure 11:
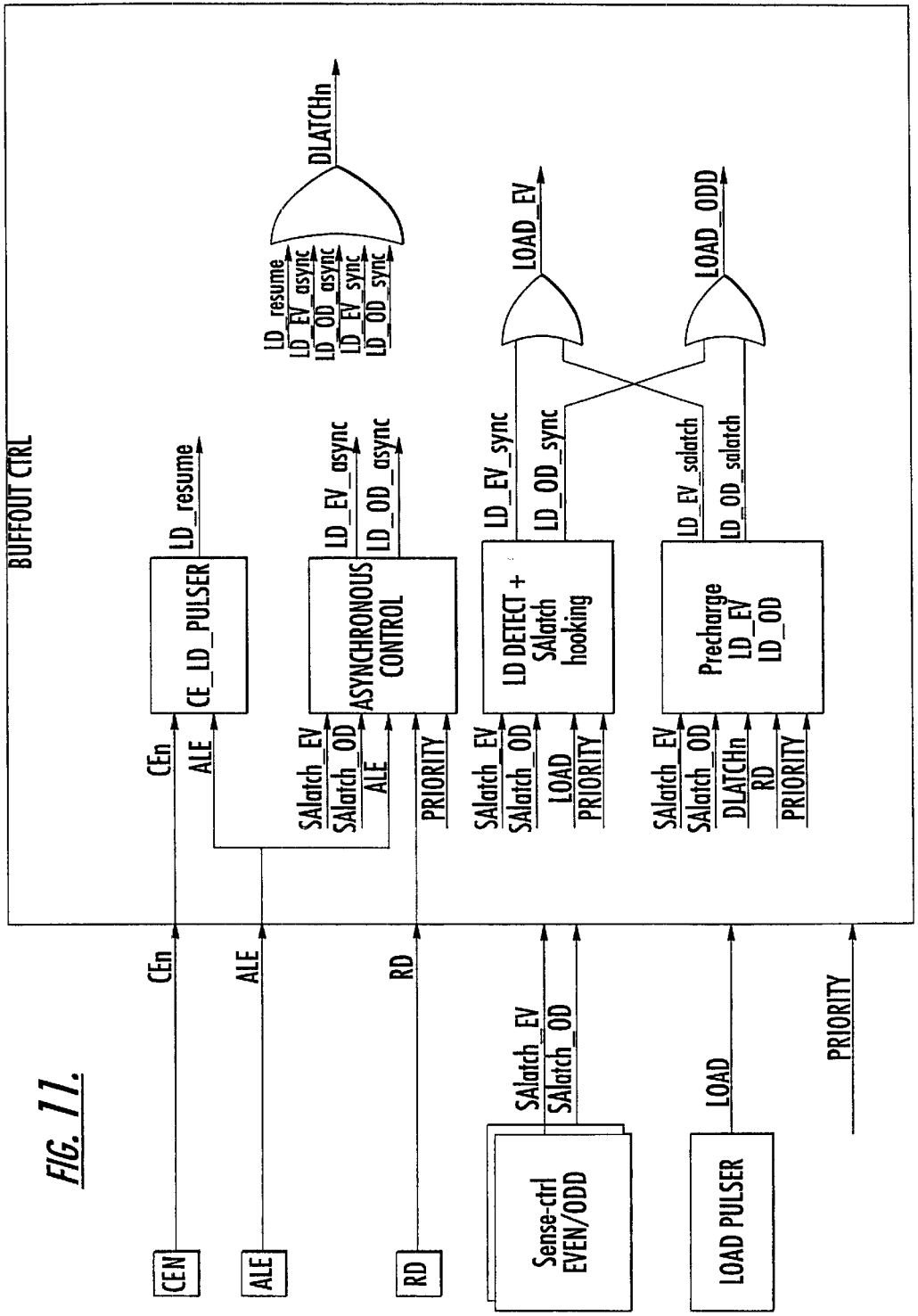
FIG. 11 is a block diagram of the data output control circuit according to the present invention.

The functional structure of the block BUFFOUT_CTRL is depicted in FIG. 11. The main blocks forming the structure of FIG. 11 and their functions are the block managing the asynchronous functioning; the block detecting the primary LOAD signal with a locking function to the SAlatch signal; the block anticipating the signals LOAD_EV and LOAD_OD with respect to the DLATCH signal; and the block generating the DLATCH in case of RESUME.

In an asynchronous mode, the signal DLATCH is generated by LOAD_EV_ASYNC and LOAD_OD_ASYNC, which are always exactly dependent in an exclusive manner from their respective signals SAlatch_EV and SAlatch_OD that are produced each time new data is ready to be output by the sense amplifiers. In a synchronous mode, the asynchronous control block is disabled and the relative LOAD signals (EV or OD) are produced by distinct functional blocks as described below.

Detection of the LOAD Signal with SAlatch Locking

Figure 12:
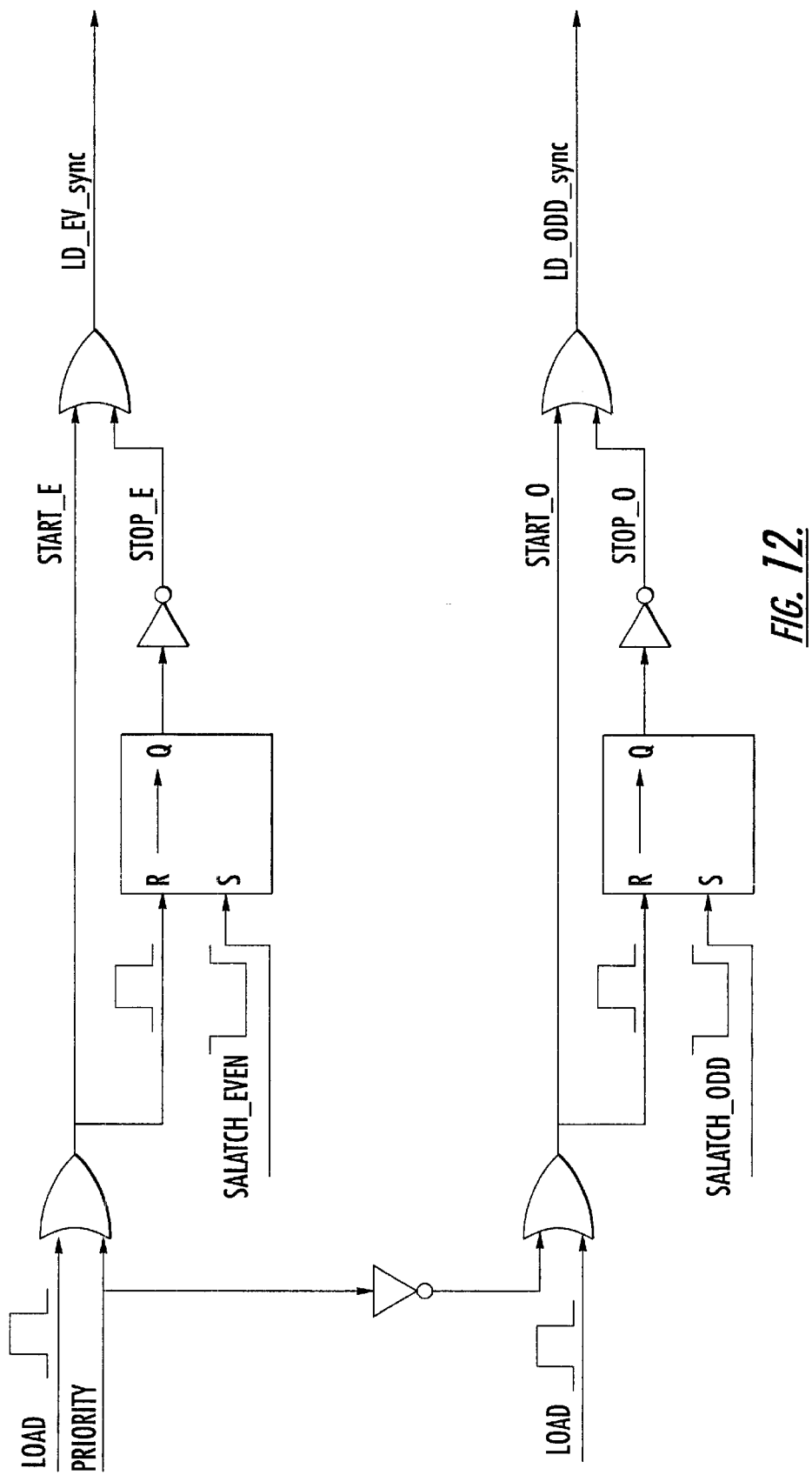
FIG. 12 is a diagram of the circuit for detecting a LOAD pulse and for locking with a SAlatch signal according to the present invention.

This block, the functional circuit diagram of which is depicted in FIG. 12, detects the presence of two simultaneous events. These two events are a request of output data and updating in progress of the output latch of the sense amplifiers in progress. In particular, the delay condition of the closing of the second event with respect to the first one is detected. In this case, the particular locking mechanism advantageously extends the associated pulses LOAD and DLATCHN by conditioning them to the end of a complete and correct updating period of the output latches of the sense amplifiers.

Pre-load LOAD_EV and LOAD_OD

Figure 14:
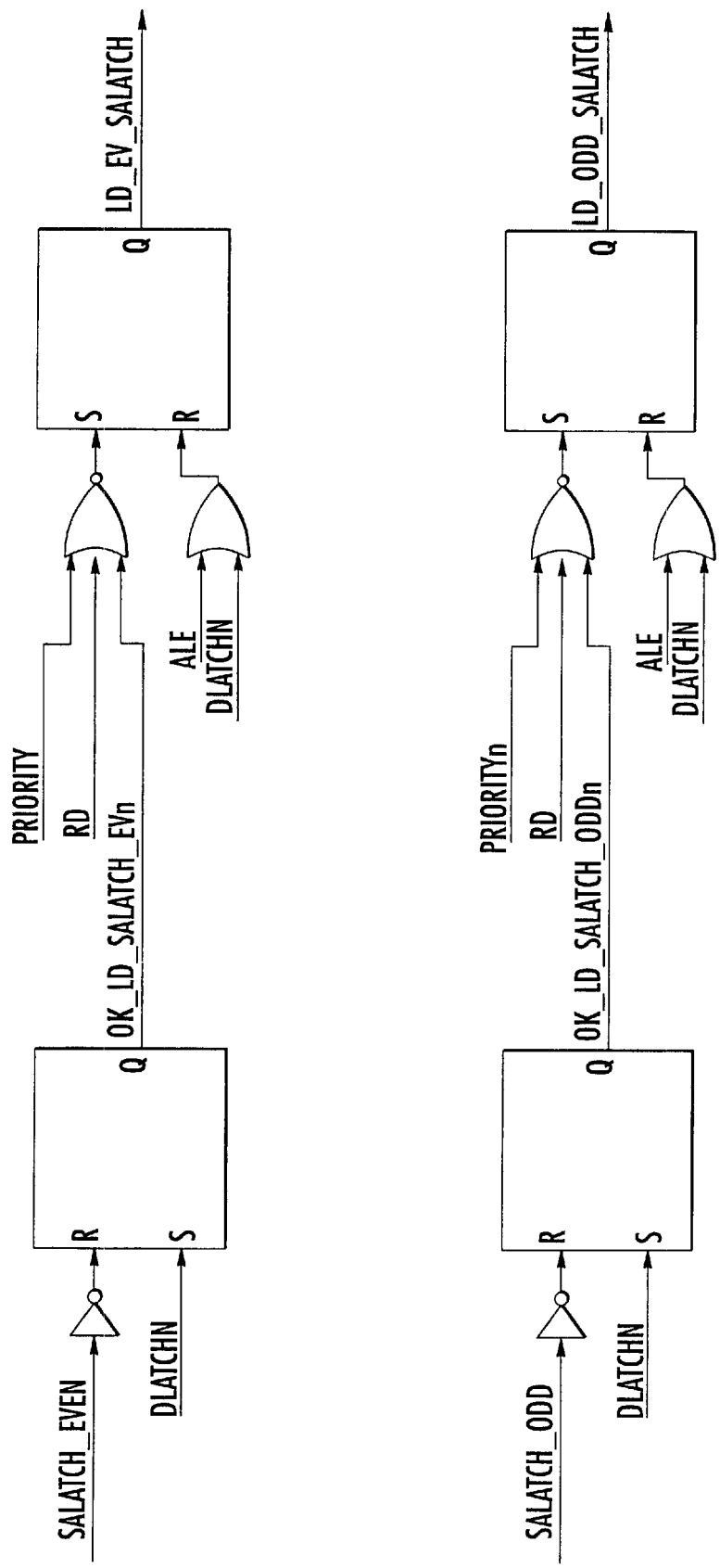
FIG. 14 is a block diagram of the circuit that controls the preloading of data according to the present invention.

This block, the functional circuit diagram of which is depicted in FIGS. 12 and 14, enables the transfer of the data present in the output latches of the sense amplifiers to the data output register if the current read cycle has terminated before a request of the data (rising edge of RD). It must be observed that the signal DLATCHN that remains tied to the effective request by the protocol is not generated.

Detection of the LOAD Signal with SAlatch Locking

This block detects the external request of the data being sensible to the primary LOAD signal and starts the generation of an effective specific command LOAD_EV_SYNC or LOAD_OD_SYNC, depending on the priority. The primary LOAD signal is produced by the LOAD_PULSER in coincidence with the leading edge of RD. The width of such a pulse is modulated by the SAlatch signal. Therefore, the starting of the pulses LOAD_EV_SYNC or LOAD_OD_SYNC is established by the primary LOAD signal while their duration depends on the duration of the respective SAlatch signal.

Pre-load LOAD_EV and LOAD_OD

Figure 13:
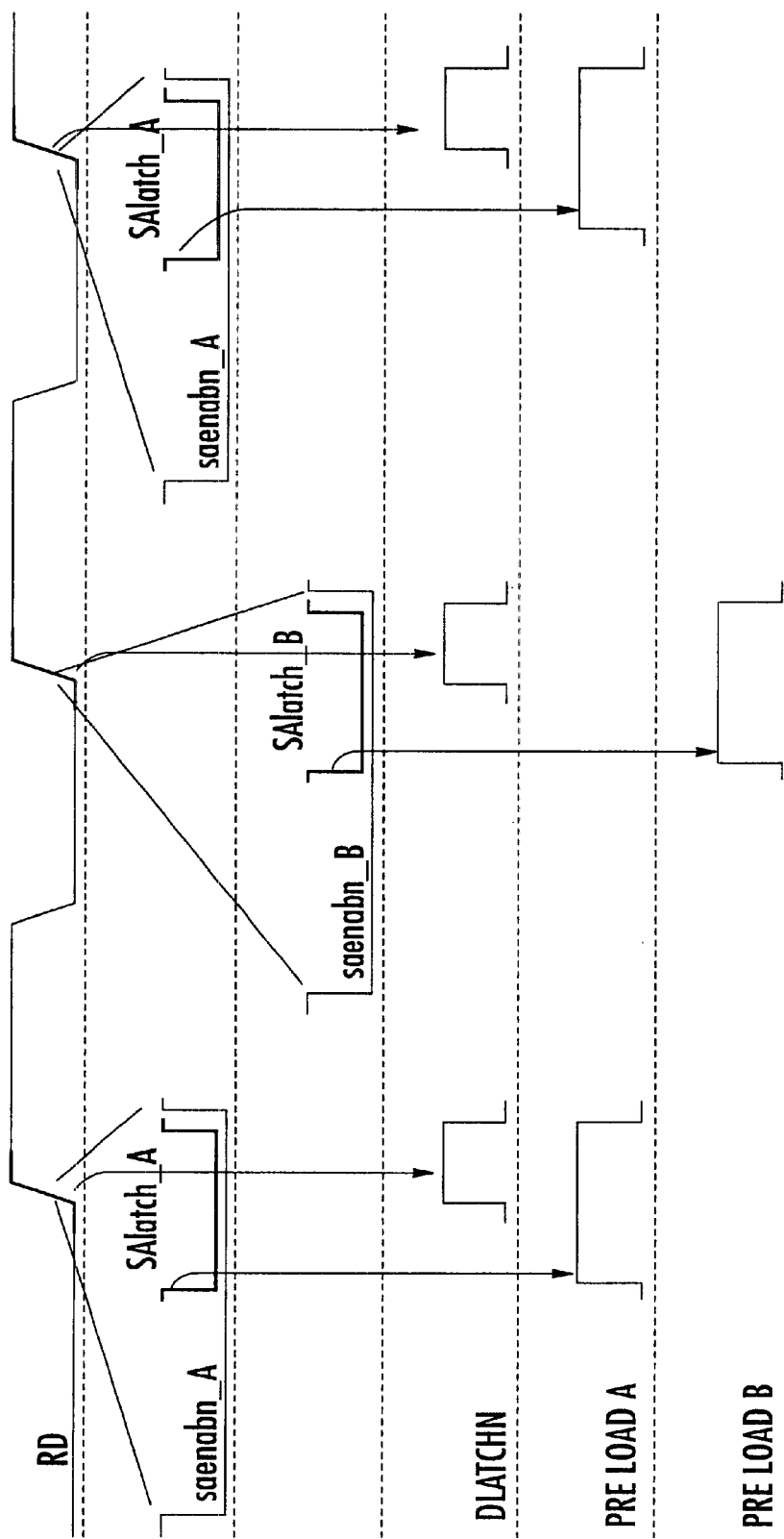
FIG. 13 is a timing diagram showing the time evolution of the signals involved in preloading the data in the output data register according to the present invention.

The function of this block is to anticipate, whenever possible, the transfer of the data from the output latches of the sense amplifiers to the output data register. By referring to FIG. 13 it is evident that if:

- the external signal RD has returned to the logic zero,
- the pulse DLATCHN has ended (i.e., the path from the output data register latch to the output buffers is disabled), and
- the signal SAlatch has come from the SENSE_CRTL of the other bank (i.e., the successive data is ready in the output latches of the sense amplifiers of the other bank), it is possible to transfer such new data in the output data register.

In other words, the updating of the output register is advantageously anticipated even if the effective request for new data established by a new rising edge of the external command RD has not yet been detected. This anticipation allows the gain of precious nanoseconds for the so-called $TOE_{sync}$ (Time Output Enable).

It must be emphasized that the anticipated updating of the output data register latch has no effect on the output buffers, the coupling of which to the output pipeline depends solely by the signal DLATCHN. In other words, the new read data is not made visible to the outside until requested by the external clock RD.

That which is claimed is:

1. An interleaved memory having an interleaved data path and comprising:
   an array of memory cells being divided into a first bank of memory cells and a second bank of memory cells;
   first and second arrays of sense amplifiers respectively coupled to said first and second banks of memory cells;
   first and second read registers respectively coupled to said first and second arrays of sense amplifiers;
   an array of output buffers;
   a control and timing circuit connected to said first and second arrays of sense amplifiers, and having inputs for receiving externally generated command signals and outputs for providing path selection signals and a control signal;
   a third register connected to said first and second read registers and having inputs for receiving read data therefrom as a function of the path selection signals; and
   an array of pass-gates connected to said third register and being controlled in common by the control signal for enabling a transfer of the read data stored in said third register to said array of output buffers.

2. An interleaved memory according to claim 1, wherein said control and timing circuit comprises:
   a pulse generator circuit for generating a primary loading pulse for loading the read data into said third register;
   a first circuit for controlling generation of the primary loading pulse during a random access asynchronous read cycle and having inputs for receiving a plurality of command signals for the transfer of the read data to said third register; and
   a second circuit for controlling sequential access synchronous read cycles and having a first input for receiving at least one of the plurality of command signals and a second input for receiving the primary loading pulse.

3. An interleaved memory according to claim 2, wherein said control and timing circuit further comprises a multiplexer having a first input for receiving an external timing signal, a second input for receiving an output signal from said first circuit and a selection input for receiving an output signal from said second circuit for selecting the first input during the sequential access synchronous read cycles, and an output connected to said pulse generator circuit.

4. An interleaved memory according to claim 2, wherein the plurality of command signals includes an address latch enabling signal, a confirmation signal for equalization of said first and second arrays of sense amplifiers, an increment pulse for internal address counters and at least one of the path enabling signals.

5. An interleaved memory according to claim 2, wherein said control and timing circuit further comprises a modulation circuit for modulating duration of the primary loading pulse during the random access asynchronous read cycle to correspond to duration of a primary enabling pulse for enabling transfer of the read data in one of said first and second read registers.

6. An interleaved memory according to claim 5, wherein said modulation circuit comprises an AND gate having a first inverting input for receiving the primary enabling pulse and a second input for receiving the output signal from said second circuit.

7. An interleaved memory according to claim 3, further comprising a pass-gate connected between the output of said multiplexer and an input of said pulse generator circuit for providing the primary loading pulse, said pass-gate having a control input connected to an output of said pulse generator circuit.

8. An interleaved memory according to claim 1, wherein said control and timing circuitry further comprises a secondary control circuit for generating secondary loading pulses for the read data in said first and second read registers based upon at least a primary loading pulse and a priority flag selecting one of said first and second banks of memory cells, and for generating the control signal for enabling data paths to respective inputs of said array of output buffers in synchronization with the secondary loading pulse which are in synchronization with the externally generated command signals for a sequential access synchronous read mode or a random access asynchronous read mode of the interleaved memory.

9. An interleaved memory according to claim 1, wherein the interleaved memory is readable in a sequential access synchronous read mode and in a random access asynchronous read mode.

10. An interleaved memory having an interleaved data path and comprising:
an array of memory cells being divided into a first bank of memory cells and a second bank of memory cells;
first and second arrays of sense amplifiers respectively coupled to said first and second banks of memory cells;
first and second read registers respectively coupled to said first and second arrays of sense amplifiers;
an array of output buffers;
a control and timing circuit connected to said first and second arrays of sense amplifiers, and having inputs for receiving externally generated command signals and outputs for providing path selection signals and a control signal; and
a third register connected to said first and second read registers and having inputs for receiving read data therefrom as a function of the path selection signals;
said control and timing circuit comprising
a pulse generator circuit for generating a primary loading pulse for loading the read data into said third register,
a first circuit for controlling generation of the primary loading pulse during a random access asynchronous read cycle and having inputs for receiving a plurality of command signals for the transfer of the read data to said third register, and
a second circuit for controlling sequential access synchronous read cycles and having a first input for receiving at least one of the plurality of command signals and a second input for receiving the primary loading pulse.

11. An interleaved memory according to claim 10, further comprising an array of pass-gates connected to said third register and being controlled in common by the control signal for enabling a transfer of the read data stored in said third register to said array of output buffers.

12. An interleaved memory according to claim 10, wherein said control and timing circuit further comprises a multiplexer having a first input for receiving an external timing signal, a second input for receiving an output signal from said first circuit and a selection input for receiving an output signal from said second circuit for selecting the first input during the sequential access synchronous read cycles, and an output connected to said pulse generator circuit.

13. An interleaved memory according to claim 10, wherein the plurality of command signals includes an address latch enabling signal, a confirmation signal for equalization of said first and second arrays of sense amplifiers, an increment pulse for internal address counters and at least one of the path enabling signals.

14. An interleaved memory according to claim 10, wherein said control and timing circuit further comprises a modulation circuit for modulating duration of the primary loading pulse during the random access asynchronous read cycle to correspond to duration of a primary enabling pulse for enabling transfer of the read data in one of said first and second read registers.

15. An interleaved memory according to claim 14, wherein said modulation circuit comprises an AND gate having a first inverting input for receiving the primary enabling pulse and a second input for receiving the output signal from said second circuit.

16. An interleaved memory according to claim 12, further comprising a pass-gate connected between the output of said multiplexer and an input of said pulse generator circuit for providing the primary loading pulse, said pass-gate having a control input connected to an output of said pulse generator circuit.

17. An interleaved memory according to claim 10, wherein said control and timing circuitry further comprises a secondary control circuit for generating secondary loading pulses for the read data in said first and second read registers based upon at least a primary loading pulse and a priority flag selecting one of said first and second banks of memory cells, and for generating the control signal for enabling data paths to respective inputs of said array of output buffers in synchronization with the secondary loading pulse which are in synchronization with the externally generated command signals for a sequential access synchronous read mode or a random access asynchronous read mode of the interleaved memory.

18. An interleaved memory according to claim 10, wherein the interleaved memory is readable in a sequential access synchronous read mode and in a random access asynchronous read mode.

19. A circuit for providing an interleaved data path for an interleaved memory comprising an array of memory cells being divided into a first bank of memory cells and a second bank of memory cells, first and second arrays of sense amplifiers respectively coupled to the first and second banks of memory cells, first and second read registers respectively coupled to the first and second arrays of sense amplifiers, and an array of output buffers, the circuit comprising:
a control and timing circuit connected to the first and second arrays of sense amplifiers, and having inputs for receiving externally generated command signals and outputs for providing path selection signals and a control signal;
a third register connected to the first and second read registers and having inputs for receiving data therefrom as a function of the path selection signals; and
an array of pass-gates connected to said third register and being controlled in common by the control signal for enabling a transfer of the read data stored in said third register to the array of output buffers.

20. A circuit according to claim 19, wherein said control and timing circuit comprises:

a pulse generator circuit for generating a primary loading pulse for loading the read data into said third register;

a first circuit for controlling generation of the primary loading pulse during a random access asynchronous read cycle and having inputs for receiving a plurality of command signals for the transfer of the read data to said third register; and a second circuit for controlling sequential access synchronous read cycles and having a first input for receiving at least one of the plurality of command signals and a second input for receiving the primary loading pulse.

21. A circuit according to claim 20, wherein said control and timing circuit further comprises a multiplexer having a first input for receiving an external timing signal, a second input for receiving an output signal from said first circuit and a selection input for receiving an output signal from said second circuit for selecting the first input during the sequential access synchronous read cycles, and an output connected to said pulse generator circuit.

22. A circuit according to claim 20, wherein the plurality of command signals includes an address latch enabling signal, a confirmation signal for equalization of said first and second arrays of sense amplifiers, an increment pulse for internal address counters and at least one of the path enabling signals.

23. A circuit according to claim 20, wherein said control and timing circuit further comprises a modulation circuit for modulating duration of the primary loading pulse during the random access asynchronous read cycle to correspond to duration of a primary enabling pulse for enabling transfer of the read data in one of the first and second read registers.

24. A circuit according to claim 23, wherein said modulation circuit comprises an AND gate having a first inverting input for receiving the primary enabling pulse and a second input for receiving the output signal from said second circuit.

25. A circuit according to claim 21, further comprising a pass-gate connected between the output of said multiplexer and an input of said pulse generator circuit for providing the primary loading pulse, said pass-gate having a control input connected to an output of said pulse generator circuit.

26. A circuit according to claim 19, wherein said control and timing circuitry further comprises a secondary control circuit for generating secondary loading pulses for the read data in the first and second read registers based upon at least a primary loading pulse and a priority flag selecting one of the first and second banks of memory cells, and for generating the control signal for enabling data paths to respective inputs of the array of output buffers in synchronization with the secondary loading pulse which are in synchronization with the externally generated command signals for a sequential access synchronous read mode or a random access asynchronous read mode of the interleaved memory.

27. A circuit according to claim 19, wherein the interleaved memory is readable in a sequential access synchronous read mode and in a random access asynchronous read mode.

28. A method for providing an interleaved data path in an interleaved memory comprising an array of memory cells being divided into a first bank of memory cells and a second bank of memory cells, first and second arrays of sense amplifiers respectively coupled to the first and second banks of memory cells, first and second read registers respectively coupled to the first and second arrays of sense amplifiers, and an array of output buffers, the method comprising:

providing externally generated command signals to a control and timing circuit for generating path selection signals and a control signal;

transferring read data from the first and second read registers to a third register as a function of the path selection signals; and controlling in common an array of pass-gates connected to the third register for enabling a transfer of the read data stored in the third register to the array of output buffers.

29. A method according to claim 28, further comprising:

generating a primary loading pulse for loading the read data into the third register;

controlling generation of the primary loading pulse using a first circuit during a random access asynchronous read cycle, the first circuit having inputs for receiving a plurality of command signals for the transfer of the read data to the third register; and controlling sequential access synchronous read cycles using a second circuit having a first input for receiving at least one of the plurality of command signals and a second input for receiving the primary loading pulse.

30. A method according to claim 29, further comprising multiplexing an external timing signal, an output signal from the first circuit and an output signal from the second circuit for selecting the external timing signal during the sequential access synchronous read cycles.

31. A method according to claim 29, wherein the plurality of command signals includes an address latch enabling signal, a confirmation signal for equalization of the first and second arrays of sense amplifiers, an increment pulse for internal address counters and at least one of the path enabling signals.

32. A method according to claim 29, further comprising modulating duration of the primary loading pulse during the random access asynchronous read cycle to correspond to duration of a primary enabling pulse for enabling transfer of the read data in one of said first and second read registers.

33. A method according to claim 28, further comprising:

generating secondary loading pulses for the read data in the first and second read registers based upon at least a primary loading pulse and a priority flag selecting one of the first and second banks of memory cells; and generating the control signal for enabling data paths to respective inputs of the array of output buffers in synchronization with the secondary loading pulse which are in synchronization with the externally generated command signals for a sequential access synchronous read mode or a random access asynchronous read mode of the interleaved memory.

34. A method according to claim 28, wherein the interleaved memory is readable in a sequential access synchronous read mode and in a random access asynchronous read mode.

* * * * *